(12) United States Patent
Chiang et al.

(10) Patent No.: US 11,107,772 B2
(45) Date of Patent: Aug. 31, 2021

(54) SEMICONDUCTOR PACKAGE AND METHOD OF MANUFACTURING SEMICONDUCTOR PACKAGE

(71) Applicant: Taiwan Semiconductor Manufacturing Co., Ltd., Hsinchu (TW)

(72) Inventors: Tsung-Hsien Chiang, Hsinchu (TW); Hsien-Ming Tu, Hsinchu County (TW); Hao-Yi Tsai, Hsinchu (TW); Tin-Hao Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/285,216

(22) Filed: Feb. 26, 2019

(65) Prior Publication Data

US 2020/0273806 A1    Aug. 27, 2020

(51) Int. Cl.
| | |
|---|---|
| *H01L 23/544* | (2006.01) |
| *H01L 23/538* | (2006.01) |
| *H01L 23/00* | (2006.01) |
| *H01L 21/48* | (2006.01) |
| *H01L 21/56* | (2006.01) |
| *B23K 26/352* | (2014.01) |

(Continued)

(52) U.S. Cl.
CPC .......... *H01L 23/544* (2013.01); *B23K 26/352* (2015.10); *H01L 21/4853* (2013.01); *H01L 21/4857* (2013.01); *H01L 21/565* (2013.01); *H01L 21/568* (2013.01); *H01L 23/3128* (2013.01); *H01L 23/5383* (2013.01); *H01L 23/5386* (2013.01); *H01L 23/5389* (2013.01); *H01L 23/562* (2013.01); *H01L 24/19* (2013.01); *H01L 24/20* (2013.01); *B23K 2101/40* (2018.08); *H01L 2223/54406* (2013.01); *H01L 2224/214* (2013.01)

(58) Field of Classification Search
CPC ......... H01L 23/544; H01L 2223/54426; B81C 99/007
USPC ....................................................... 257/668
See application file for complete search history.

(56) References Cited

U.S. PATENT DOCUMENTS

2015/0348904 A1* 12/2015 Huang ................ H01L 23/5389
                                                                  257/774

* cited by examiner

*Primary Examiner* — Walter H Swanson
(74) *Attorney, Agent, or Firm* — JCIPRNET

(57) ABSTRACT

A semiconductor package includes an encapsulated semiconductor device, a backside redistribution structure, and a front side redistribution structure. The encapsulated semiconductor device includes an encapsulating material and a semiconductor device encapsulated by the encapsulating material. The backside redistribution structure is disposed on a backside of the encapsulated semiconductor device and includes a redistribution circuit layer and a first patterned dielectric layer. The redistribution circuit layer has a circuit pattern and a dummy pattern electrically insulated from the circuit pattern. The dummy pattern is overlapped with the semiconductor device from a top view of the semiconductor package. The first patterned dielectric layer is disposed on the redistribution circuit layer and includes a marking pattern disposed on the dummy pattern and revealing a part of the dummy pattern. The front side redistribution structure is disposed on a front side of the encapsulated semiconductor device and electrically connected to the semiconductor device.

20 Claims, 13 Drawing Sheets

(51) Int. Cl.
*H01L 23/31* (2006.01)
*B23K 101/40* (2006.01)

SEMICONDUCTOR PACKAGE AND METHOD OF MANUFACTURING SEMICONDUCTOR PACKAGE

BACKGROUND

As the production rates of semiconductor devices (frequently referred to as "chips"), including packaged die, have increased, manufacturers of semiconductor devices have searched for ways to quickly and efficiently mark their product. Typically, finished semiconductor devices are marked with the company name, a part or serial number, or other information such as lot number. As production continue to increase, however, current marking techniques may not efficiently meet the demand.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
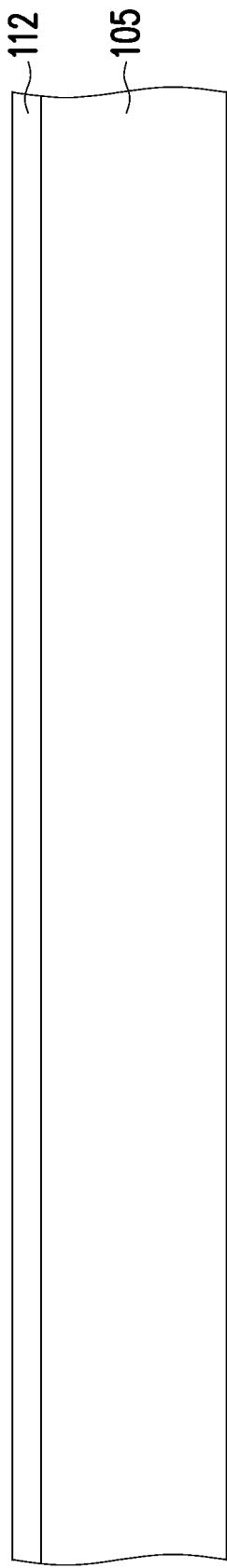
FIG. 1 to FIG. 11 illustrate cross sectional views of intermediate stages in the manufacturing of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 11 illustrate cross sectional views of intermediate stages in the manufacturing of a semiconductor package according to some exemplary embodiments of the present disclosure. It is noted that the present disclosure will be described with respect to some embodiments in a specific context, namely a semiconductor package such as an integrated fan-out package. The concepts in the disclosure may also apply, however, to other semiconductor structures or circuits. The intermediate stages of forming a semiconductor package are illustrated in accordance with some embodiments. The variations of the embodiments are discussed. Throughout the various views and illustrative embodiments, like reference numbers are used to designate like elements.

Figure 11:
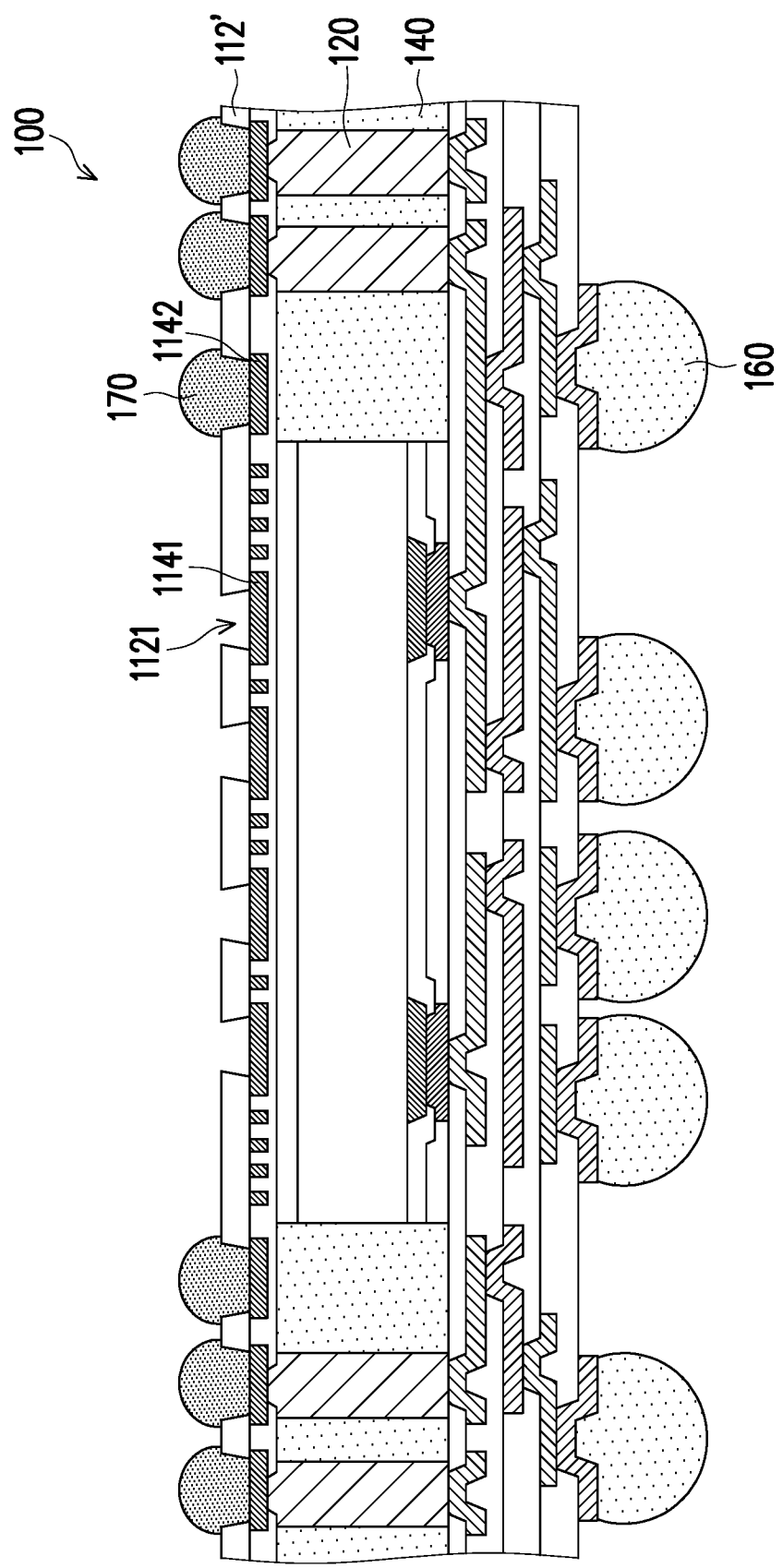

In some embodiments, the intermediate stages of forming the semiconductor package shown in FIG. 11 are described as follows. With reference to FIG. 1, a carrier 105 is provided. In some embodiments, the carrier 105 may include, for example, silicon based materials, such as glass, ceramics or silicon oxide, or other materials, such as aluminum oxide, combinations of any of these materials, or the like. The carrier 105 may be planar in order to accommodate an attachment of a semiconductor device such as a semiconductor device 130 (not illustrated in FIG. 1, but illustrated and discussed below with respect to FIG. 5). In some embodiment, a release layer (not shown) may be disposed on the carrier 105. The release layer 106 may be removed along with carrier 105 from the overlying structures that will be formed in subsequent steps. The release layer may include an adhesive or a glue material. In some embodiments, the release layer may be dispensed as a liquid and cured. In other embodiments, the release layer may be formed by lamination. In some embodiments, the release layer is photosensitive and is easily detached from the carrier 105 by irradiating with ultra-violet (UV) light or laser. For example, the release layer may include a light-to-heat-conversion (LTHC) coating. In some other embodiments, the release layer includes heat-sensitive adhesive.

In some embodiments, a backside redistribution structure 110 (illustrated in FIG. 3) is formed on the carrier 105, or on the release layer (if any). The method of forming the backside redistribution structure 110 shown in FIG. 3 may include the following steps. Firstly, a first dielectric layer 112 may be formed on the carrier 105, or on the release layer (if any). In some embodiments, the first dielectric layer 112 may be formed of dielectric materials such as oxides, nitrides, carbides, carbon nitrides, polybenzoxazole (PBO), polyimide, polyimide derivative, combinations thereof, and/or multi-layers thereof. Any suitable dielectric materials may alternatively be utilized. The first dielectric layer 112 may be placed using, e.g., a spin-coating process to a thickness of between about 2 µm and about 15 µm, such as about 5 µm, although any suitable method and thickness may alternatively be used.

Figure 2:
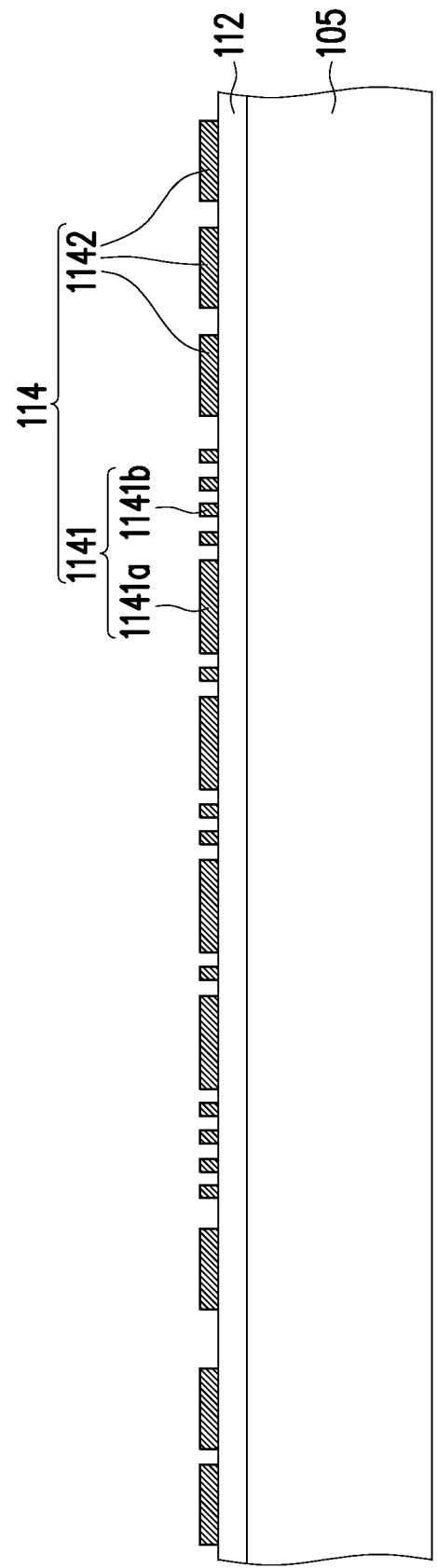
Figure 3:
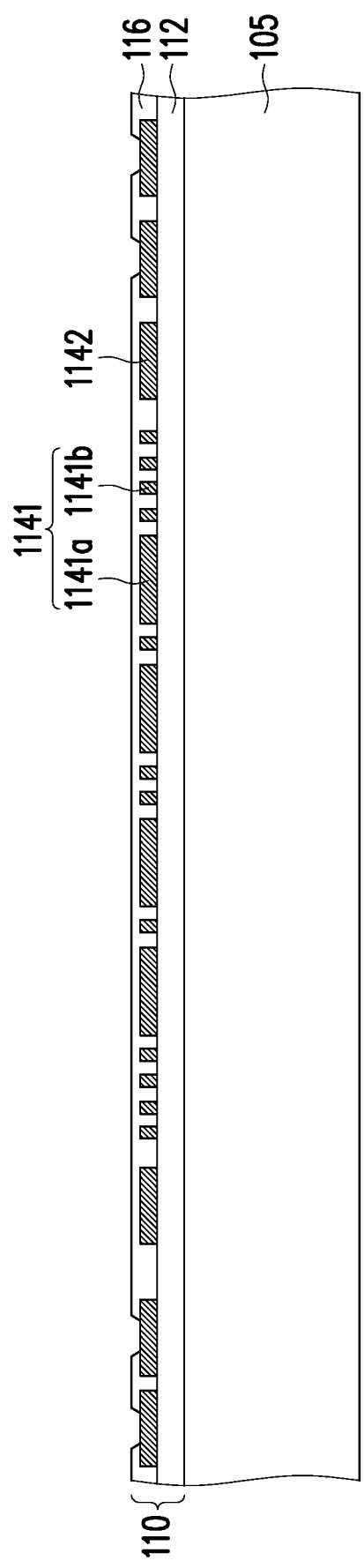
Figure 4:
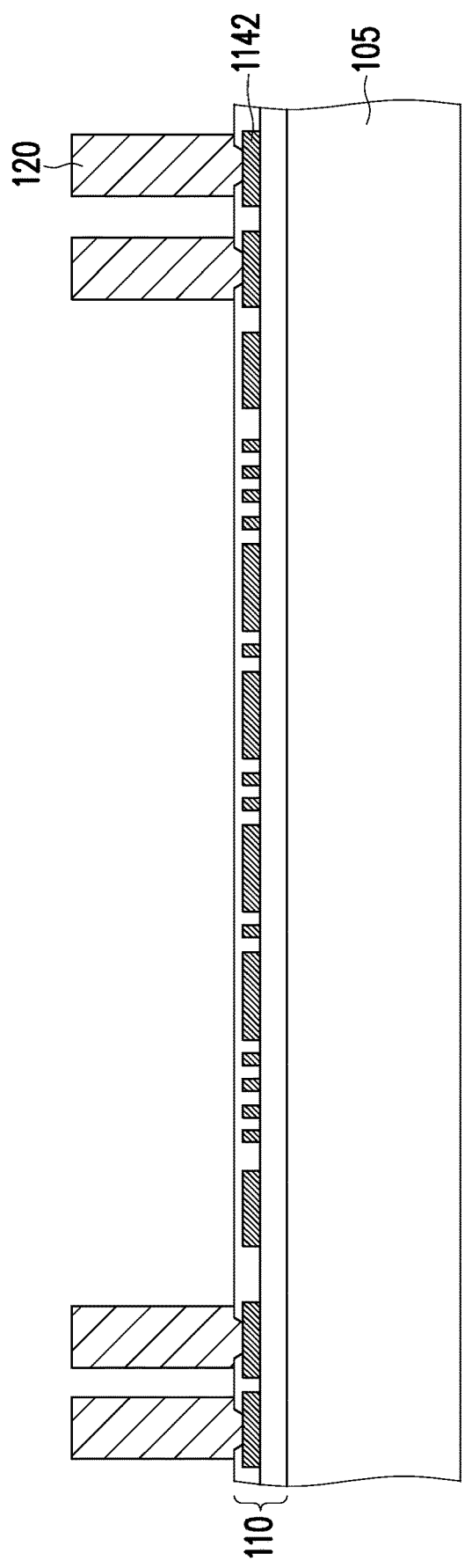

Then, with now reference to FIG. 2, a redistribution circuit layer 114 is formed on first dielectric layer 112. The material of the redistribution circuit layer 114 may include a metal or a metal alloy including aluminum, copper, tungsten, and/or alloys thereof, and the redistribution circuit layer 114 may be formed by, for example, plating process. In accordance with some embodiments of the disclosure, the redistribution circuit layer 114 includes a dummy pattern 1141 and a circuit pattern 1142. The circuit pattern 1142 is configured for forming electrical connection with other components, and the dummy pattern 1141 is electrically insulated from the circuit pattern 1142. In some embodiments, the dummy pattern 1141 may be distributed evenly on the first dielectric layer 112 where the circuit pattern 1142 is not disposed, and is configured to avoid or at least reduce stress concentration of the semiconductor package 100.

Figure 12:
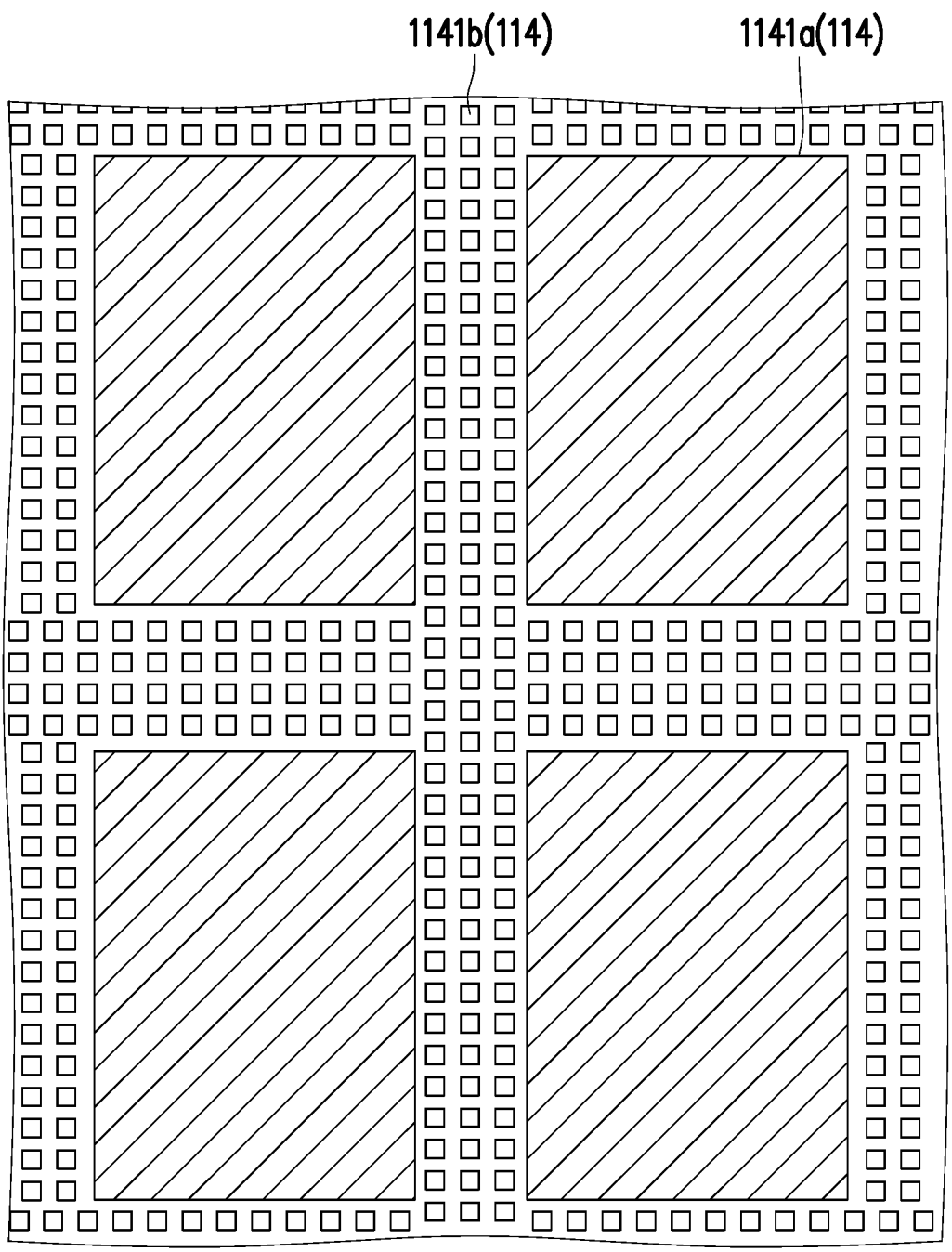
FIG. 12 illustrates a partial top view of a dummy pattern of a semiconductor package according to some exemplary embodiments of the present disclosure.

FIG. 12 illustrates a partial top view of a dummy pattern of a semiconductor package according to some exemplary embodiments of the present disclosure. With now reference to FIG. 2 and FIG. 12, in some embodiments, the dummy pattern 1141 may include a plurality of first dummy pads 1141a and a plurality of second dummy pads 1141b. The first dummy pads 1141a may be arranged in an array manner, and the second dummy pads 1141b surround each of the first dummy pads 1141a. The second dummy pads 1141b may also be arranged in an array manner and fill the gap between the first dummy pads 1141a. In some embodiments, a size of each of the first dummy pads 1141a is substantially greater than a size of each of the second dummy pads 1141b. For example, a size of each of the first dummy pads 1141a may substantially range from about 550 μm to about 750 μm, and a size of each of the second dummy pads 1141b may substantially range from about 10 μm to about 30 μm. In some embodiments, a ratio of a size of each of the first dummy pads 1141a to a size of each of the second dummy pads 1141b ranges from 15 to 75.

In accordance with some embodiments of the disclosure, a second patterned dielectric layer 116 may be formed on the redistribution circuit layer 114. In some embodiments, the second dielectric layer 116 covers the dummy pattern 1141 and reveals the circuit pattern 1142 underneath, such that the circuit pattern 1142 can be electrically connected to the overlying structures such as through vias 120 shown in FIG. 4. The second patterned dielectric layer 116 may be utilized in order to provide protection to, for example, the semiconductor device 130 shown in FIG. 5 once the semiconductor device 130 have been attached. In an embodiment, the insulating layer may be polybenzoxazole (PBO), although any suitable material, such as polyimide or a polyimide derivative, may alternatively be utilized. The material and the forming method of the second patterned dielectric layer 116 may be the same or similar to those of the first dielectric layer 112. At the time, the backside redistribution structure 110 shown in FIG. 3 may be substantially formed. It is noted that the present embodiment is merely for illustration. More dielectric layers and redistribution circuit layers may be stacked alternately with one another to form the backside redistribution structure 110.

Then, a plurality of through vias (conductive pillars) 120 are provided on the backside redistribution structure 110, and the through vias 120 surrounds a device area where the semiconductor device 130 to be disposed. In some embodiment, the through vias 120 are formed on and electrically connected to the circuit pattern 1142 of the redistribution circuit layer 114 by, for example, a plating process, but the disclosure is not limited thereto. In other embodiments, the through vias 120 may be pre-formed.

In the embodiment of the through vias 120 formed on the backside redistribution structure 110, the formation of the through vias 120 may include the following steps. Firstly, a seed layer may be formed over the backside redistribution structure 110. The seed layer is a thin layer of a conductive material that aids in the formation of a thicker layer during subsequent processing steps. The seed layer may be created using processes such as sputtering, evaporation, or PECVD processes, depending upon the desired materials.

Then, a photoresist is formed over the seed layer. In an embodiment, the photoresist may be placed on the seed layer using, e.g. a spin coating technique. Once in place, the photoresist may then be patterned by exposing the photoresist to a patterned energy source (e.g. a patterned light source), thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern. The pattern formed into the photoresist is a pattern for the through vias 120.

Then, the through vias 120 are formed in the photoresist by, for example, electroplating, electroless plating, or the like. In an embodiment, the through vias 120 include one or more conductive materials, such as copper, tungsten, other conductive metals, or the like. In an embodiment, an electroplating process is used for plating the exposed conductive areas of the seed layer within the opening of the photoresist. Once the through vias 120 are formed using the photoresist and the seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the underlying portions of the seed layer.

Then, the exposed portions of the seed layer (e.g., those portions that are not covered by the through vias 120) may be removed by, for example, a wet or dry etching process. For example, in a dry etching process reactants may be directed towards the seed layer, using the through vias 120 as masks. Alternatively, etchants may be sprayed or otherwise put into contact with the seed layer in order to remove the exposed portions of the seed layer. At this point, the formation of the through vias 120 is substantially done. The through vias 120 are formed in such a placement as to be located on different sides of subsequently attached semiconductor device 130. In other words, the semiconductor device 130 are surrounded by the through vias 120. However, any suitable arrangement for the pattern of through vias 120 may alternatively be utilized.

Figure 5:
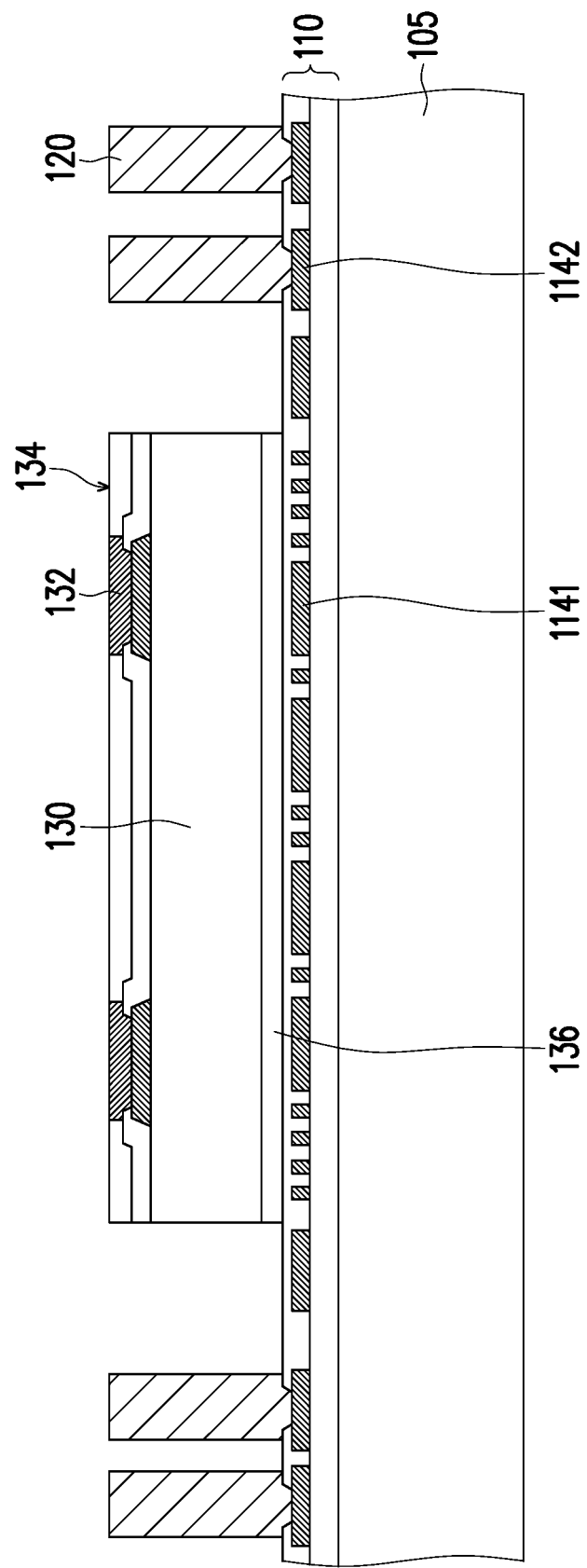

With reference now to FIG. 5, in some embodiments, at least one semiconductor device 130 (one semiconductor device 130 are illustrated, but not limited thereto) may be provided on the backside redistribution structure 110 and within or between the through vias 120. In some embodiments, the dummy pattern 1141 is overlapped with the semiconductor device 130 from a top view of the semiconductor package. In one of the implementations, the semiconductor device 130 is located right above the dummy pattern 1141. In accordance with some embodiments of the disclosure, the semiconductor device 130 may be disposed on a central region of the backside redistribution structure 110 while the through vias 120 are disposed on a peripheral region surrounding the central region. Accordingly, the dummy pattern 1141 is disposed within the central region corresponding to the semiconductor device 130 for avoiding or reducing stress concentration on the semiconductor device 130, and the circuit pattern 1142 is disposed within the peripheral region corresponding to the through vias 120 for being electrically connected to the through vias 120. It is noted that "central" and "peripheral" herein may not be interpreted literally but rather be deemed as spatially relative terms, which are intended to encompass different orientations of the device in use or operation in addition to the orientation depicted in the figures.

In some embodiments, the semiconductor device 130 may include at least one semiconductor device set. The semiconductor device set may include a plurality of semiconductor devices electrically connected through, e.g., a front side redistribution structure 150 (not illustrated in FIG. 5 but illustrated and discussed below with respect to FIG. 7) and may be utilized together in order to provide a desired functionality to an end user. In some embodiments, the semiconductor device 130 may be attached to the backside redistribution structure 110 using an adhesive material 136 such as a die attach film (DAF), although any suitable method of attachment may alternatively be utilized. The through vias 120 may surround the semiconductor device 130. In some embodiments, the semiconductor device 130 may be a logic device die including logic circuits therein. In some exemplary embodiments, the semiconductor device 130 may be a device that is designed for mobile applications, and may include a Power Management Integrated Circuit (PMIC) die and a Transceiver (TRX) die, for example. It is noted that more or less semiconductor device 130 may be placed over the backside redistribution structure 110 and level with one another.

In some exemplary embodiments, the semiconductor device 130 may include an active surface 134, a plurality of electrical contacts 132 disposed on the active surface 134 and a back surface opposite to the active surface 134. In some embodiments, the semiconductor device 130 may be disposed on the backside redistribution structure 110 with the active surface 134 facing away from the backside redistribution structure 110. Namely, the back surface of the semiconductor device 130 faces the backside redistribution structure 110. In some embodiments, the electrical contacts 132 may be formed on the active surface (e.g. the top surface) of the semiconductor device 130. The substrate of the semiconductor device 130 may include bulk silicon, doped or undoped, or an active layer of a silicon-on-insulator (SOI) substrate. Generally, an SOI substrate includes a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. The semiconductor device 130 may further include a wide variety of active devices and passive devices such as capacitors, resistors, inductors and the like that may be used to generate the desired structural and functional requirements of the design for the semiconductor device 130. The active devices may be formed using any suitable methods either within or else on the substrate.

In accordance with some embodiments of the disclosure, a passivation layer may be formed on the active surface 134 of the semiconductor device 130, and may cover the top surfaces of the electrical contacts 132. In other embodiments, the top surface of the passivation layer may be substantially level with the top surfaces of the electrical contacts 132. Alternatively, the passivation layer may be omitted, and the electrical contacts 132 protrude from the active surface 134 of the semiconductor device 130. The passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer may be formed through a process such as chemical vapor deposition (CVD), although any suitable process may be utilized. In some embodiments, the top ends of the through vias 120 may be substantially level with the top surfaces of the electrical contacts 132. In other embodiments, the top ends of the through vias 120 may be substantially higher than the top surfaces of the electrical contacts 132. Alternatively, the top ends of the through vias 120 may be substantially lower than the top surfaces of the electrical contacts 132 but substantially higher than the bottom surfaces of the electrical contacts 132.

Figure 6:
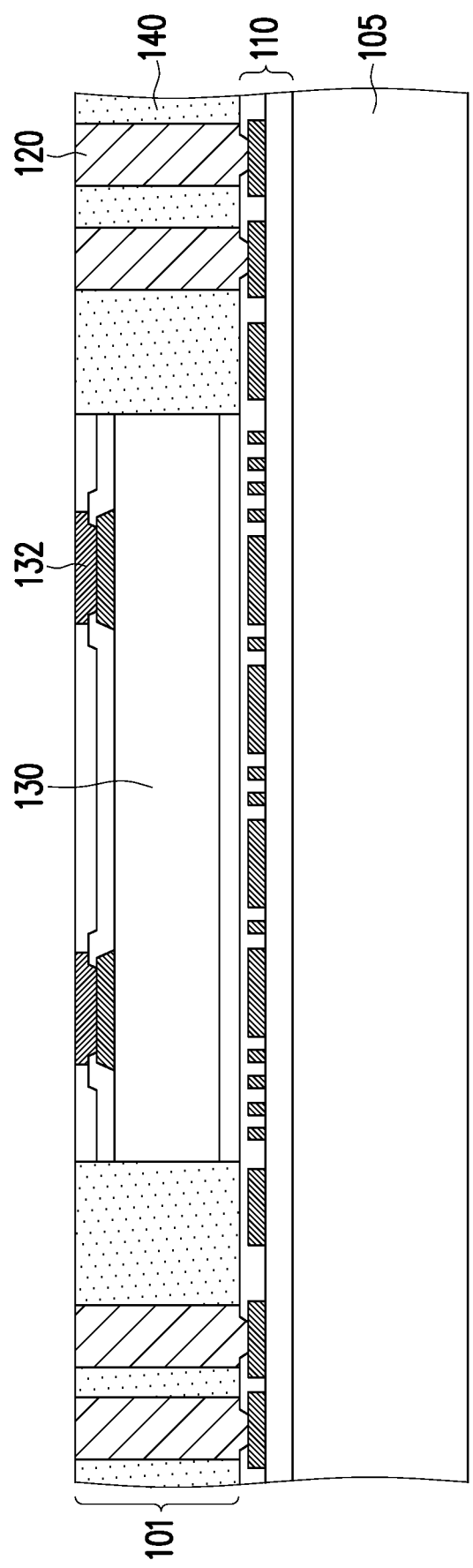

With reference now to FIG. 6, in some embodiments, an encapsulating material 140 is formed on the backside redistribution structure 110 to encapsulate the through vias 120 and the semiconductor device 130. In some embodiments, the encapsulating material 140 fills the gaps between the semiconductor device 130 and the through vias 120, and may be in contact with the backside redistribution structure 110. The encapsulating material 140 may include a molding compound resin such as polyimide, PPS, PEEK, PES, a heat resistant crystal resin, combinations of these, or the like. The encapsulation of the semiconductor device 130 and the through vias 120 may be performed in a molding device (not shown). The encapsulating material 140 may be placed within a molding cavity of the molding device, or else may be injected into the molding cavity through an injection port.

Once the encapsulating material 140 has been placed into the molding cavity such that the encapsulating material 140 encapsulates the backside redistribution structure 110, the semiconductor device 130 and the through vias 120, the encapsulating material 140 may be cured in order to harden the encapsulating material 140 for optimum protection. Additionally, initiators and/or catalysts may be included within the encapsulating material 140 to better control the curing process. In some embodiments, a top surface of the encapsulating material 140 may be higher than the top ends of the through vias 120 and the top surface of the semiconductor device 130. Namely, the encapsulating material 140 covers the top ends of the through vias 120 and the top surface of the semiconductor device 130.

Then, a thinning process may be performed on the encapsulating material 140 to reveal the top ends of the through vias 120 and the top surfaces of the electrical contacts 132 for further processing. The thinning process may be, for example, a mechanical grinding or CMP process whereby chemical etchants and abrasives are utilized to react and grind away the encapsulating material 140 until the through vias 120, the electrical contacts 132 have been revealed. The resulting structure is shown in FIG. 6. After the thinning process is performed, the top ends of the through vias 120 are substantially level with the top surfaces of the electrical contacts 132, and are substantially level with the top surface of the encapsulating material 140 and the top surface of the passivation layer (if any) as shown in FIG. 6. However, while the CMP process described above is presented as one illustrative embodiment, it is not intended to be limiting to the embodiments. Any other suitable removal process may alternatively be used to thin the encapsulating material 140 and expose the through vias 120. For example, a series of chemical etches may alternatively be utilized. This process and any other suitable process may alternatively be utilized to thin the encapsulating material 140, the semiconductor device 130 and the through vias 120, and all such processes are fully intended to be included within the scope of the embodiments.

Throughout the description, the resultant structure including the semiconductor device 130, the through vias 120 and the encapsulating material 140 as shown in FIG. 6 is referred to as encapsulated semiconductor device 101. It is noted that the encapsulated semiconductor device 101 may have a wafer form in the process. Accordingly, a plurality of semiconductor packages can be formed concurrently for batch production. For the sake of brevity and clarity, the manufacturing process are described regarding one of the semiconductor packages. In the encapsulated semiconductor device 101, the semiconductor device 130 are disposed at the die area of the backside redistribution structure 110, the through vias 120 extend through the encapsulated semiconductor device 101 outside of the die area, and the encapsulating material 140 encapsulates the semiconductor device 130 and the through vias 120. In other words, the encapsulating material 140 encapsulates the semiconductor device 130 therein, and the through vias 120 extends through the encapsulating material 140. In some embodiments, the second patterned dielectric layer 116 of the backside redistribution structure 110 is located between the encapsulated semiconductor device 101 and the redistribution circuit layer 114 and isolated the dummy pattern 1141 from the encapsulated semiconductor device 101.

Figure 7:
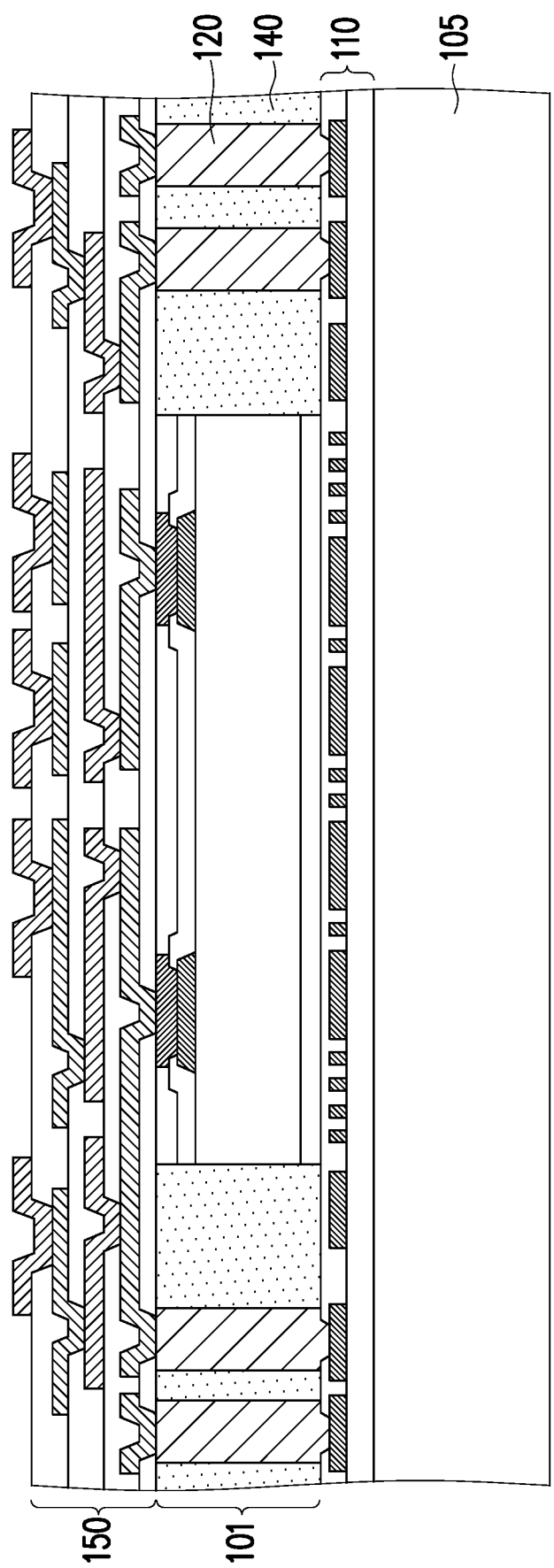

With reference now to FIG. 7, a front side redistribution structure 150 is formed on a front side of the encapsulated semiconductor device 101. In some embodiments, the active surface 134 of the semiconductor device 130 faces the front side redistribution structure 150, and the front side redistribution structure 150 is electrically connected to the semiconductor device 130 and the through vias 120. In some embodiments, the front side redistribution structure 150 are formed over the encapsulated semiconductor device 101 (including the encapsulating material 140 and the semiconductor device 130) to connect to the electrical contacts 132 of the semiconductor device 130 and the through vias 120. In some embodiments, the front side redistribution structure 150 may also interconnect the electrical contacts 132 and the through vias 120. The front side redistribution structure 150 may be formed by, for example, depositing conductive layers, patterning the conductive layers to form redistribution circuit layers, partially covering the redistribution circuit layers and filling the gaps between the redistribution circuit layers with dielectric layers, etc. The material of the redistribution circuit layers may include a metal or a metal alloy including aluminum, copper, tungsten, and/or alloys thereof. The dielectric layers may be formed of dielectric materials such as oxides, nitrides, carbides, carbon nitrides, combinations thereof, and/or multi-layers thereof. The redistribution circuit layers are formed in the dielectric layers and electrically connected to the semiconductor device 130 and the through vias 120. In some embodiments, the backside redistribution structure 110 is located on a backside of the encapsulated semiconductor device 101 opposite to the front side where the front side redistribution structure 150 is disposed. That is to say, the front side redistribution structure 150 and the backside redistribution structure 110 are respectively disposed on two opposite sides of the encapsulated semiconductor device 101.

Figure 8:
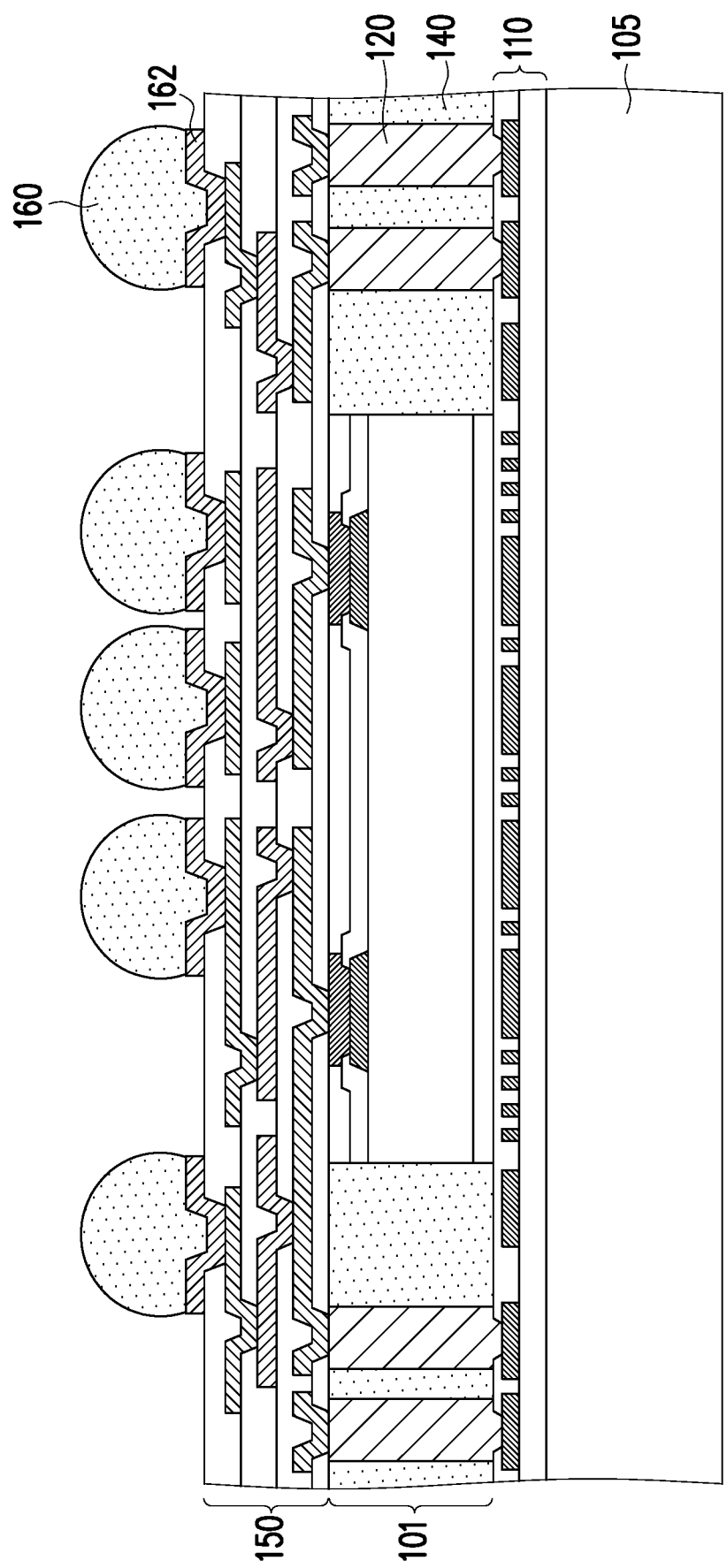

With reference now to FIG. 8, a plurality of conductive bumps 160 are disposed on the front side redistribution structure 150. In some embodiments, an under bump metallurgy (UBM) layer 162 may be formed on the front side redistribution structure 150 by sputtering, evaporation, or electroless plating, etc., and the conductive bumps 160 may be disposed on the UBM layer 162. In some embodiments, at least one integrated passive device (IPD) may also be disposed on the front side redistribution structure 150 in accordance with some exemplary embodiments. The formation of the conductive bumps 160 may include placing solder balls on the UBM layer 162 (or on the front side redistribution structure 150), and then reflowing the solder balls. In alternative embodiments, the formation of the conductive bumps 160 may include performing a plating process to form solder regions on the UBM layer 162 (or on the first redistribution structure 140), and then reflowing the solder regions. The IPD may be fabricated using standard wafer fabrication technologies such as thin film and photolithography processing, and may be mounted on the UBM layer 162 (or on the front side redistribution structure 150) through, for example, flip-chip bonding or wire bonding, etc.

Throughout the description, the resultant structure overlaying the carrier 105 that includes the front side redistribution structure 150, the encapsulated semiconductor device 101, the backside redistribution structure 110, and the conductive bumps 160 shown in FIG. 8 is referred to as a package structure, which may have a wafer form in the process.

Figure 9:
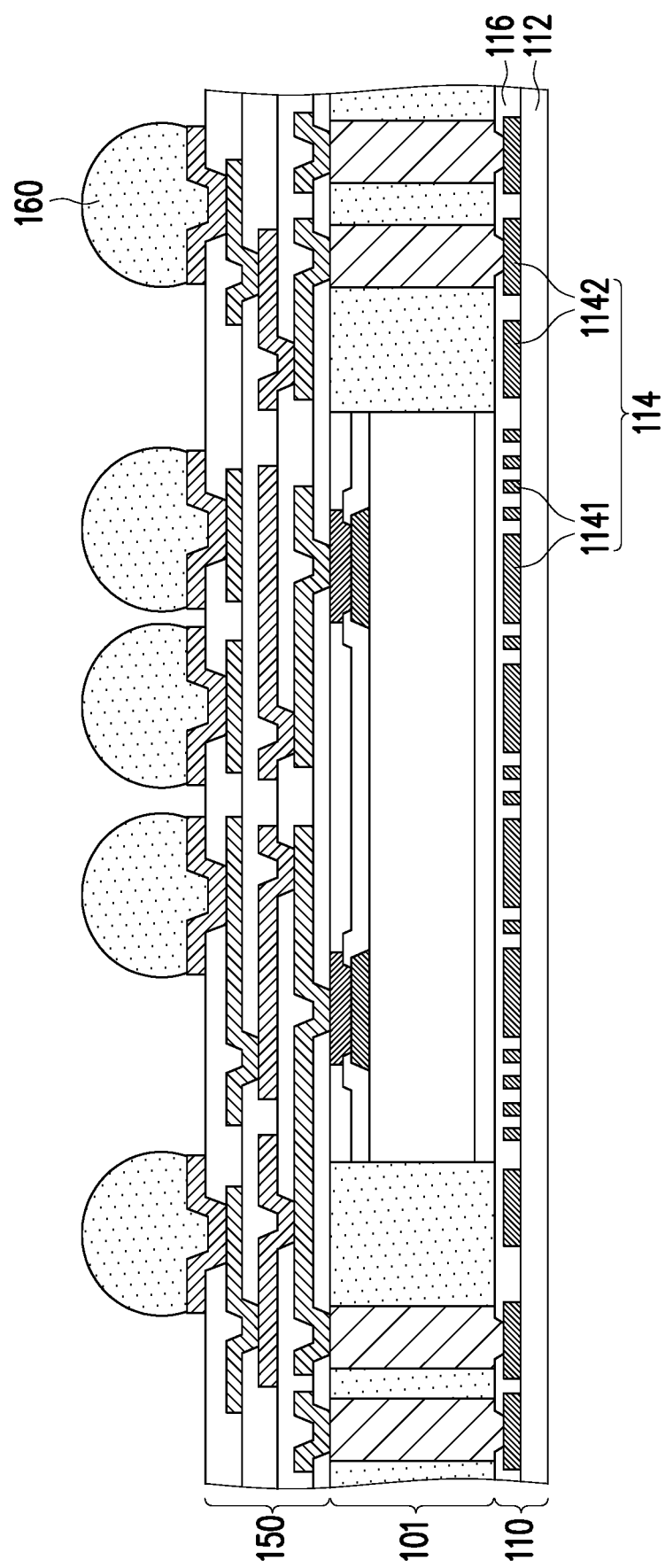
Figure 10:
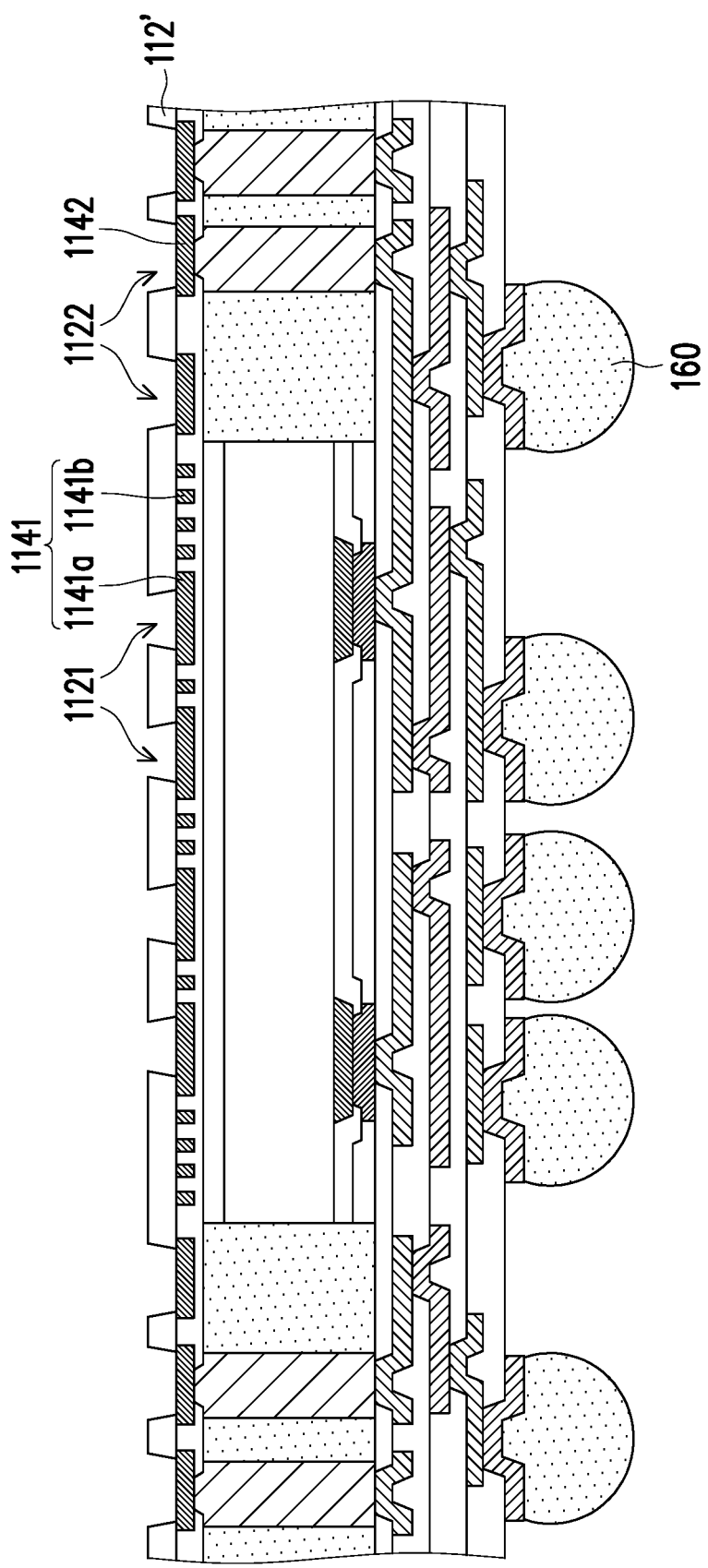

With reference now to FIG. 8 and FIG. 9, the carrier 105 is removed from the first dielectric layer 112 of the backside redistribution structure 110, and the first dielectric layer 112 is revealed. The carrier 105 may be removed using, for example, a thermal process to alter the adhesive properties of the release layer on the carrier 105. In an embodiment, an energy source such as an ultraviolet (UV) laser, a carbon dioxide (CO2) laser, or an infrared (IR) laser, is utilized to irradiate and heat the release layer until the release layer loses at least some of its adhesive properties. Once performed, the carrier 105 and the release layer thereon may be physically separated and removed from the package structure as it is shown in FIG. 9. In accordance with some embodiments of the disclosure, before the carrier 105 is removed, the package structure with the carrier 105 may firstly be flipped over to be disposed on a carrier substrate (not shown) by attaching the conductive bumps 160 to the carrier substrate, and then the carrier 105 may be removed. In some embodiments, the carrier substrate may be a tape carrier with a frame structure intended to provide support and stability for the structure during the sequential process. In some embodiments, the carrier substrate may be the same as or similar to the carrier 105.

Figure 13:
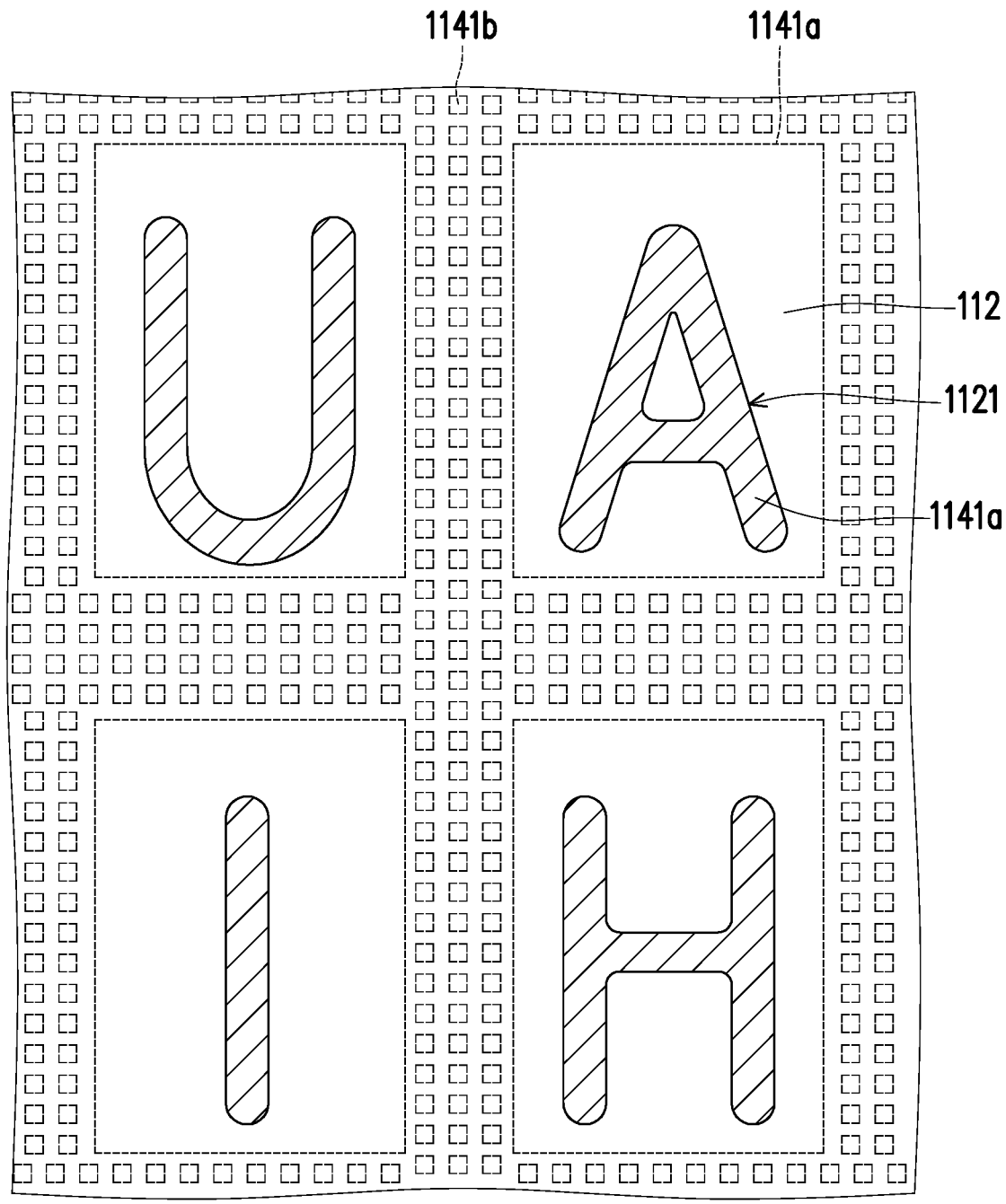
FIG. 13 illustrates a partial top view of a semiconductor package according to some exemplary embodiments of the present disclosure.

FIG. 13 illustrates a partial top view of a semiconductor package according to some exemplary embodiments of the present disclosure. With now reference to FIG. 10 and FIG. 13, a patterning process is performed on the first dielectric layer 112 that is revealed by the carrier 105, so as to form the first patterned dielectric layer 112' shown in FIG. 10. In accordance with some embodiments of the disclosure, the first patterned dielectric layer 112' may include a plurality of contact openings 1122 for revealing the circuit pattern 1142 underneath. In some embodiments, the contact openings 1122 may be formed by a patterning process such as a photolithography process or a laser drilling process, but the disclosure is not limited thereto.

In accordance with some embodiments of the disclosure, the first patterned dielectric layer 112' may further include a marking pattern 1121 to reveal a part of the dummy pattern 1141 underneath. In some embodiments, the marking pattern 1121 may be a patterned opening revealing a part of the dummy pattern 1141 underneath for marking the information such as company name, a part or serial number, or other information such as lot number, etc., on the semiconductor package 100. In some embodiments, the marking pattern 1121 is disposed on the first dummy pads 1141a and revealing a part of the first dummy pad 1141a. With the arrangement of the second dummy pads 1141b surrounding the first dummy pads 1141a larger than the second dummy pads 1141b, the marking pattern 1121 can be formed (carved) on the first dummy pads 1141a to mark the information such as company name, a part, serial number, lot number, etc., instead of being formed on an additional sacrificial layer. Therefore, the production cost of the semiconductor package 100 can be saved, the manufacturing process of the semiconductor package 100 can be simplified, and the overall thickness of the semiconductor package 100 can be further reduced.

In some embodiments, the patterning process for forming the marking pattern 1121 may include a laser marking process, or a photolithography process, but the disclosure is not limited thereto. In accordance with some embodiments of the disclosure, the contact openings 1122 and the marking pattern 1121 may be formed by two different patterning process. For example, the contact openings 1122 can be formed by photolithography process for revealing the circuit pattern 1142 underneath, and the marking pattern 1121 is formed by laser marking process to mark the information such as company name, a part, serial number, lot number on the first patterned dielectric layer 112'. In an alternative embodiment, the contact openings 1122 and the marking pattern 1121 may be formed by the same patterning process such as photolithography process or laser process in one step. The disclosure is not limited thereto.

With now reference to FIG. 11, a plurality of conductive bumps 170 are disposed on the contact openings 1122 of the first patterned dielectric layer 112' and electrically connected to the circuit pattern 1142. In some embodiments, an UBM layer may be formed on the backside redistribution structure 110' by sputtering, evaporation, or electroless plating, etc., and the conductive bumps 170 may be disposed on the UBM layer. In some embodiments, at least one IPD may also be disposed on the backside redistribution structure 110' in accordance with some exemplary embodiments. The formation of the conductive bumps 170 may be the same as or similar to that of the conductive bumps 160. In the present embodiments, the marking pattern 1121 is formed before the conductive bumps 170 are disposed on the contact openings 1122. However, in an alternative embodiment, the marking pattern 1121 can be formed after the conductive bumps 170 are disposed on the contact openings 1122. The disclosure does not limit the formation timing of the marking pattern 1121. At the time, the manufacturing process of the semiconductor package 100 is substantially done.

Figure 14:
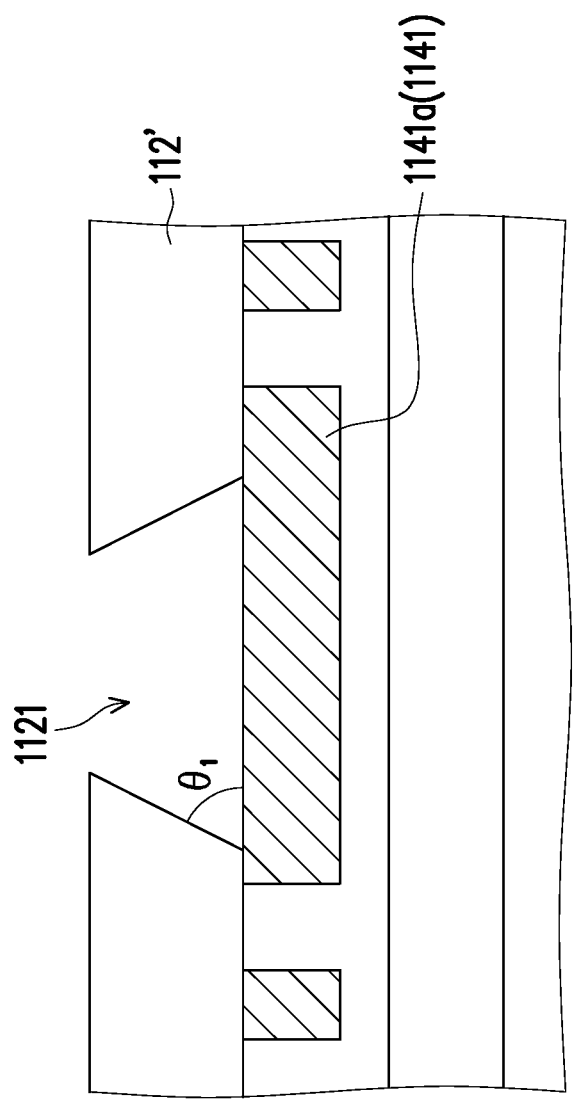
FIG. 14 illustrates a partial enlarged view of the semiconductor package in FIG. 11 according to some exemplary embodiments of the present disclosure.

FIG. 14 illustrates a partial enlarged view of the semiconductor package in FIG. 11 according to some exemplary embodiments of the present disclosure. With now reference to FIG. 14, in the embodiments of the marking pattern 1121 being formed by laser marking process, an acute angle $\theta_i$ is included between a side wall of the marking pattern 1121 and an upper surface of the redistribution circuit layer 1141a. That is to say, by forming marking pattern 1121 with laser, the angle $\theta_i$ included between the side wall of the marking pattern 1121 and the upper surface of the redistribution circuit layer 1141a is substantially smaller than 90°. In some embodiments, the angle $\theta_i$ substantially ranges from about 30° to about 60°. In one of the implementations, the angle $\theta_i$ included between the side wall of the marking pattern 1121 and the upper surface of the redistribution circuit layer 1141a is about 45°.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor package includes an encapsulated semiconductor device, a backside redistribution structure and a front side redistribution structure. The encapsulated semiconductor device includes an encapsulating material and a semiconductor device encapsulated by the encapsulating material. The backside redistribution structure is disposed on a backside of the encapsulated semiconductor device and includes a redistribution circuit layer and a first patterned dielectric layer. The redistribution circuit layer has a circuit pattern and a dummy pattern electrically insulated from the circuit pattern, wherein the dummy pattern is overlapped with the semiconductor device from a top view of the semiconductor package. The first patterned dielectric layer is disposed on the redistribution circuit layer and includes a marking pattern disposed on the dummy pattern and revealing a part of the dummy pattern. The front side redistribution structure is disposed on a front side of the encapsulated semiconductor device and electrically connected to the semiconductor device, wherein an active surface of the semiconductor device faces the front side redistribution structure.

In accordance with some embodiments of the disclosure, a semiconductor package includes an encapsulated semiconductor device, a backside redistribution structure and a front side redistribution structure. The encapsulated semiconductor device includes an encapsulating material and a semiconductor device encapsulated by the encapsulating material. The backside redistribution structure is disposed on a backside of the encapsulated semiconductor device and includes a redistribution circuit layer and a first patterned dielectric layer. The redistribution circuit layer has a dummy pattern, wherein the dummy pattern includes a plurality of first dummy pads and a plurality of second dummy pads surrounding the first dummy pads, and a size of each of the first dummy pads is substantially greater than a size of each of the second dummy pads. The first patterned dielectric layer is disposed on the redistribution circuit layer and includes a marking pattern disposed on the plurality of first dummy pads and revealing a part of the plurality of first dummy pad. The front side redistribution structure is disposed on a front side of the encapsulated semiconductor device and electrically connected to the semiconductor device.

In accordance with some embodiments of the disclosure, a method of manufacturing a semiconductor package includes the following steps. A backside redistribution structure is formed on a carrier, wherein forming the backside redistribution structure on the carrier includes: forming a first dielectric layer on the carrier; forming a first dielectric layer on the carrier; and forming a redistribution circuit layer having a circuit pattern and a dummy pattern electrically insulated from the circuit pattern. An encapsulated semiconductor device is formed on the backside redistribution structure, wherein the encapsulated semiconductor device includes an encapsulating material and a semiconductor device encapsulated by the encapsulating material, and the semiconductor device is overlapped with the dummy pattern from a top view of the semiconductor package. A front side redistribution structure is formed on the encapsulated semiconductor device, wherein the front side redistribution structure is electrically connected to the semiconductor device. The carrier is removed from the first dielectric layer. A patterning process is performed on the first dielectric layer to form a first patterned dielectric layer including a marking pattern to reveal a part of the dummy pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
an encapsulated semiconductor device comprising an encapsulating material and a semiconductor device encapsulated by the encapsulating material;
a backside redistribution structure disposed on a backside of the encapsulated semiconductor device and comprising:
a redistribution circuit layer having a circuit pattern and a dummy pattern electrically insulated from the circuit pattern, wherein the dummy pattern is overlapped with the semiconductor device from a top view of the semiconductor package; and
a first patterned dielectric layer disposed on the redistribution circuit layer and comprising a marking pattern opening located on the dummy pattern and exposing a part of the dummy pattern; and
a front side redistribution structure disposed on a front side of the encapsulated semiconductor device and electrically connected to the semiconductor device, wherein an active surface of the semiconductor device faces the front side redistribution structure.

2. The semiconductor package as claimed in claim 1, wherein the dummy pattern comprises a plurality of first dummy pads and a plurality of second dummy pads surrounding the first dummy pads, and a size of each of the first dummy pads is substantially greater than a size of each of the second dummy pads.

3. The semiconductor package as claimed in claim 2, wherein the marking pattern opening is located on the plurality of first dummy pads and exposing a part of one of the plurality of first dummy pads.

4. The semiconductor package as claimed in claim 2, wherein the plurality of first dummy pads are arranged in an array manner and the plurality of second dummy pads disposed between the plurality of first dummy pads.

5. The semiconductor package as claimed in claim 1, wherein the encapsulated semiconductor device further comprises a plurality of through vias extending through the encapsulating material, and the plurality of through vias is electrically connected to the circuit pattern and the front side redistribution structure.

6. The semiconductor package as claimed in claim 1, further comprising a plurality of conductive bumps disposed on the first patterned dielectric layer and electrically connected to the circuit pattern.

7. The semiconductor package as claimed in claim wherein the backside redistribution structure further comprising a second patterned dielectric layer disposed between the encapsulated semiconductor device and the redistribution circuit layer and isolates the dummy pattern from the encapsulated semiconductor device.

8. The semiconductor package as claimed in claim 1, wherein an acute angle is included between a side wall of the marking pattern opening and an upper surface of the redistribution circuit layer.

9. The semiconductor package as claimed in claim 8, wherein the acute angle ranges from 30 degrees to 60 degrees.

10. The semiconductor package as claimed in claim 1, wherein the backside redistribution structure having a central region overlapped with the semiconductor device from the top view and a peripheral region surrounding the central region, the dummy pattern is disposed within the central region, and the circuit pattern is disposed within the peripheral region.

11. The semiconductor package as claimed in claim 1, wherein the semiconductor device is attached to the backside redistribution structure by a die attach film.

12. A semiconductor package, comprising:
an encapsulated semiconductor device comprising an encapsulating material and a semiconductor device encapsulated by the encapsulating material;
a backside redistribution structure disposed on a backside of the encapsulated semiconductor device and comprising:
a redistribution circuit layer having a dummy pattern, wherein the dummy pattern comprises a plurality of first dummy pads and a plurality of second dummy pads disposed between the first dummy pads, and a size of each of the first dummy pads is substantially greater than a size of each of the second dummy pads; and
a first patterned dielectric layer disposed on the redistribution circuit layer and comprising a marking pattern opening located on the plurality of first dummy pads and exposing a part of one of the plurality of first dummy pads; and
a front side redistribution structure disposed on a front side of the encapsulated semiconductor device and electrically connected to the semiconductor device.

13. The semiconductor package as claimed in claim 12, wherein the plurality of first dummy pads are arranged in an array manner.

14. The semiconductor package as claimed in claim 12, wherein the dummy pattern is overlapped with the semiconductor device from a top view of the semiconductor package.

15. The semiconductor package as claimed in claim 12, wherein the semiconductor device comprises an active surface having a plurality of electrical contacts, and the active surface faces the front side redistribution structure.

16. The semiconductor package as claimed in claim 12, wherein the encapsulated semiconductor device further comprises a plurality of through vias extending through the encapsulating material, the redistribution circuit layer further comprises a circuit pattern electrically insulated from the dummy pattern, and the plurality of through vias is electrically connected to the circuit pattern and the front side redistribution structure.

17. The semiconductor package as claimed in claim 16, further comprising a plurality of conductive bumps disposed on the first patterned dielectric layer and electrically connected to the circuit pattern.

18. The semiconductor package as claimed in claim 12, wherein the backside redistribution structure further comprising a second patterned dielectric layer disposed between the encapsulated semiconductor device and the redistribution circuit layer and isolating the dummy pattern from the encapsulated semiconductor device.

19. The semiconductor package as claimed in claim 12, wherein an acute angle is included between a side wall of the marking pattern opening and an upper surface of the redistribution circuit layer.

20. The semiconductor package as claimed in claim 12, wherein the semiconductor device is attached to the backside redistribution structure by a die attach film.

* * * * *